(12) United States Patent
Ito

(10) Patent No.: US 9,144,118 B2
(45) Date of Patent: Sep. 22, 2015

(54) LIGHT-EMITTING DEVICE, LIGHTING DEVICE, DISPLAY DEVICE, AND METHOD FOR MANUFACTURING LIGHT-EMITTING DEVICE

(75) Inventor: Shin Ito, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 13/980,493

(22) PCT Filed: Jan. 18, 2012

(86) PCT No.: PCT/JP2012/050910
§ 371 (c)(1),
(2), (4) Date: Jul. 18, 2013

(87) PCT Pub. No.: WO2012/099145
PCT Pub. Date: Jul. 26, 2012

(65) Prior Publication Data
US 2013/0300285 A1 Nov. 14, 2013

(30) Foreign Application Priority Data
Jan. 20, 2011 (JP) ................................. 2011-009608

(51) Int. Cl.
*H01J 1/62* (2006.01)
*H01J 63/04* (2006.01)
*H05B 33/02* (2006.01)
*H01L 33/46* (2010.01)
(Continued)

(52) U.S. Cl.
CPC ................ *H05B 33/02* (2013.01); *H01L 33/46* (2013.01); *H01L 33/50* (2013.01); *H01L 33/54* (2013.01)

(58) Field of Classification Search
CPC ..... H01L 33/60; H01L 33/507; H01L 33/483; H01L 33/54
USPC ................ 313/512, 501, 502; 257/98; 445/23
See application file for complete search history.

(56) References Cited

U.S. PATENT DOCUMENTS

| 6,674,096 B2 * | 1/2004 | Sommers ........................ 257/98 |
| 7,352,011 B2 * | 4/2008 | Smits et al. .................... 257/99 |
| 2004/0241894 A1 * | 12/2004 | Nagai et al. ..................... 438/22 |

(Continued)

FOREIGN PATENT DOCUMENTS

| CN | 1854770 A | 11/2006 |
| JP | 2000-156528 | 6/2000 |

(Continued)

OTHER PUBLICATIONS

International Search Report for PCT/JP2012/050910, mailed Apr. 3, 2012.

*Primary Examiner* — Anh Mai
*Assistant Examiner* — Glenn Zimmerman
(74) *Attorney, Agent, or Firm* — Nixon & Vanderhye P.C.

(57) ABSTRACT

A light-emitting device includes a light-emitting element, a phosphor layer containing a phosphor that is excited by the light emitted by the light-emitting element to emit fluorescence, a substrate with the light-emitting element and the phosphor layer on the surface, and a resin body that seals the light-emitting element and the phosphor layer. An additional member is provided on an opposite surface opposed to the light-emitting surface of the light-emitting element on the surface of the resin body. The additional member at least reflects or diffuses the light emitted by the light-emitting element and the phosphor layer.

18 Claims, 21 Drawing Sheets

(51) Int. Cl.
*H01L 33/50* (2010.01)
*H01L 33/54* (2010.01)

(56) References Cited

U.S. PATENT DOCUMENTS

| | | | |
|---|---|---|---|
| 2005/0023545 A1* | 2/2005 | Camras et al. | 257/98 |
| 2006/0118805 A1* | 6/2006 | Camras et al. | 257/98 |
| 2006/0208269 A1* | 9/2006 | Kim et al. | 257/98 |
| 2007/0187705 A1 | 8/2007 | Tanaka et al. | |
| 2007/0195534 A1 | 8/2007 | Ha et al. | |
| 2008/0074032 A1 | 3/2008 | Yano et al. | |
| 2008/0308825 A1* | 12/2008 | Chakraborty et al. | 257/98 |
| 2009/0166657 A1* | 7/2009 | Yamada et al. | 257/98 |
| 2009/0219716 A1* | 9/2009 | Weaver et al. | 362/235 |
| 2009/0242919 A1* | 10/2009 | Lin et al. | 257/98 |
| 2009/0278147 A1* | 11/2009 | Suzuki | 257/98 |
| 2009/0283779 A1 | 11/2009 | Negley et al. | |
| 2009/0283784 A1* | 11/2009 | Chang | 257/98 |
| 2009/0284149 A1* | 11/2009 | Koshikawa et al. | 313/512 |
| 2009/0296017 A1 | 12/2009 | Itoh et al. | |
| 2010/0059787 A1* | 3/2010 | Hoshina | 257/100 |
| 2010/0264431 A1* | 10/2010 | Akutsu et al. | 257/89 |
| 2010/0290234 A1* | 11/2010 | Bierhuizen et al. | 362/311.02 |
| 2011/0084299 A1* | 4/2011 | Kotani et al. | 257/98 |
| 2011/0089453 A1* | 4/2011 | Min | 257/98 |
| 2011/0114979 A1* | 5/2011 | Jang | 257/98 |
| 2011/0147778 A1* | 6/2011 | Ichikawa | 257/98 |
| 2011/0272721 A1* | 11/2011 | Butterworth | 257/98 |
| 2011/0291131 A1 | 12/2011 | Ito | |
| 2012/0224379 A1* | 9/2012 | Chang et al. | 362/310 |
| 2013/0094218 A1* | 4/2013 | Wang et al. | 362/311.02 |

FOREIGN PATENT DOCUMENTS

| | | |
|---|---|---|
| JP | 2002-344027 | 11/2002 |
| JP | 2007-018936 | 1/2007 |
| JP | 2007-180339 | 7/2007 |
| JP | 2007-220765 | 8/2007 |
| JP | 4015421 | 9/2007 |
| JP | 2008-226909 | 9/2008 |
| JP | 2008-226928 | 9/2008 |
| JP | 2009-21221 | 1/2009 |
| JP | 2010-056337 | 3/2010 |
| JP | 2010-529689 | 8/2010 |
| WO | WO 01/07828 | 2/2001 |
| WO | 2005/104247 | 11/2005 |
| WO | WO 2010/095441 A1 | 8/2010 |

* cited by examiner

LIGHT-EMITTING DEVICE, LIGHTING DEVICE, DISPLAY DEVICE, AND METHOD FOR MANUFACTURING LIGHT-EMITTING DEVICE

CROSS-REFERENCE TO RELATED APPLICATIONS

This application is a National Phase filing under 35 U.S.C. §371 of International Application No. PCT/JP2012/050910 filed on Jan. 18, 2012, and which claims priority to Japanese Patent Application No. 2011-009608 filed on Jan. 20, 2011.

TECHNICAL FIELD

The present invention relates to a light-emitting device provided with a light-emitting element as a light source, a lighting device using the light-emitting device, and a display device using the lighting device. In addition, the present invention relates to a method for manufacturing the light-emitting device.

BACKGROUND ART

A light-emitting device provided with a light-emitting element such as a light-emitting diode as a light source is utilized, for example, in a backlight of a liquid crystal display or the like. In the lighting device that is required to planarly irradiate light without unevenness in luminance, like a backlight, it is preferred if a light-emitting device that controls distribution characteristics by expanding the light emitted by the light-emitting element and emitting the light outward is utilized.

Examples of the light-emitting device described above are disclosed in Patent Documents 1 and 2. The structure of this light-emitting device will be described with reference to FIG. 14. FIG. 14 is a top view and cross-sectional view showing a schematic structure of a conventional light-emitting device. FIG. 14A is a top view, and FIG. 14B is a cross-sectional view showing an X-X cross section in FIG. 14A. Here, electrodes, wiring and the like are omitted in FIG. 14, for simplification of illustration.

As shown in FIG. 14, a light-emitting device 100 comprises a substrate 101 and a light-emitting element 102 provided on the surface of the substrate 101, and a resin body 103 that seals the light-emitting element. An opposite surface 103a that is opposed to a light-emitting surface (surface on the side opposite to the substrate 101) of the light-emitting element 102 in the resin body 103 is a depressed surface that is concavely depressed. Also, the depressed surface is an inclined surface of an inverted cone. Furthermore, the outer shape of the depressed surface of the resin body 103 is curved convex upward in the cross section that is perpendicular to the surface of the substrate and cut so as to pass through the center of the light-emitting surface of a light source (light-emitting element 102). In the light-emitting device 100, a part of the light emitted by the light-emitting element 102 is totally reflected on this depressed surface to return into the resin body 103, thereby expanding the light emitted by the light-emitting element 102 and emitting the light outward. As described above, since it is not necessary to separately provide a member that controls light distribution characteristics such as a lens, it is possible to reduce the number of the components of the light-emitting device 100.

CITATION LIST

Patent Literatures

Patent Literature 1: Japanese Patent No. 4015421
Patent Literature 2: Japanese Patent Laying-Open No. 2002-344027

SUMMARY OF THE INVENTION

Problems to be Solved by the Invention

Incidentally, the light-emitting device 100 as described above is required to be downsized, for example, for the request of a thinner backlight and a thinner liquid crystal display. However, when the light-emitting device 100 (specifically, resin body 103) is downsized, it becomes a problem since the control of light distribution characteristics described above becomes difficult. This problem will be described below with reference to FIGS. 15 to 21. In the following description, a resin body 103 is hemispherical and has a top view diameter of $\Phi$ (variable), and a light-emitting element 102 is cuboid and has each of top view four sides of 0.5 mm (constant) (refer to FIG. 14A). In addition, even if the diameter $\Phi$ of the resin body 103 is any value, the shape of the resin body 103 does not change (namely, similar shape).

First, the above problem will be described focusing on the light emitted by the light-emitting device 100. FIG. 15 is a graph showing the relationship between the diameter $\Phi$ of the resin body 103 and the light distribution characteristics, in the light-emitting device 100 shown in FIG. 14. Lambert light distribution (light distribution characteristics of the light-emitting device in which a light-emitting element is sealed with a simple hemispherical resin body) is concurrently shown in the graph shown in FIG. 15. Also, in the graph shown in FIG. 15, the intensities of the light are normalized, so that another intensity of the light, which has Lambert light distribution and which has 0 degree angle with an optical axis, is set as 1. Also, the optical axis refers to a normal line that passes through the light source, among normal lines perpendicular to the surface of the substrate provided with the light source (light-emitting element in this example) (However, when a plurality of the light-emitting elements comprising the light source is present, and when a phosphor layer described below is contained, the optical axis refers to a normal line that passes through the center of whole light source. The same shall apply hereinafter.).

As shown in FIG. 15, as the diameter $\Phi$ of the resin body 103 is smaller, the light intensity on the optical axis is increased with shifting the angle to maximize the light intensity to the low angle side. Specifically, when the diameter $\Phi$ of the resin body 103 is 2.7 mm, the light intensity on the optical axis is increased up to almost double, as compared to the case where the diameter $\Phi$ of the resin body 103 is 6 mm.

FIG. 16 is a graph showing the relationship between the diameter $\phi$ of the resin body 103 and the light intensity on the optical axis, in the light-emitting device 100 shown in FIG. 14. As shown in FIG. 16, when the diameter $\Phi$ of the resin body 103 (i.e., top view length in the cross section including the optical axis. The same shall apply hereinafter.) is 4.5 mm or less, the light intensity is steeply increased. In other words, when the diameter $\Phi$ of the resin body 103 is reduced such that the size of the light source (light-emitting element 102) in the cross section including the optical axis (0.5 mm in the present example) is 10% or more of the diameter $\Phi$ of the resin body 103, the light intensity on the optical axis is steeply increased (light is leaked along the optical axis).

As described above, as the resin body 103 is downsized, it becomes difficult to expand the light emitted by the light-emitting element 102.

Next, the above problem will be described focusing on the light emitted from the light-emitting device 100 and projected onto a projection plane. FIG. 17 is a drawing describing a projection plane onto which the light emitted from one light-emitting device 100 is projected. In the following description, as shown in FIG. 17, the projection plane is parallel to the surface of the substrate. In addition, the distances are normalized, so that another distance between the surface of the substrate and the projection plane is set as 1, and also the intersection of the optical axis of the light-emitting device 100 with the projection plane is defined as the origin O, to represent the distance in a horizontal direction perpendicular to the optical axis (distance from the optical axis in the projection plane. Hereinafter referred to as horizontal distance.).

FIG. 18 is a graph showing the intensity distribution of the light projected onto the projection plane in FIG. 17. In the graph shown in FIG. 18, the intensity distribution of the light emitted from the light-emitting device with Lambert light distribution and projected onto the projection plane is concurrently shown. Also, in the graph shown in FIG. 18, the intensities of the light are normalized, so that another intensity of the light, which has Lambert light distribution emitted from the light-emitting device and which is projected onto the origin O, is set as 1.

As shown in FIG. 18, as the resin body 103 is downsized, the light intensity at the origin O (intersection of the projection plane with the optical axis) is increased, and the light intensity difference (unevenness in luminance) in a horizontal direction is increased.

In addition, FIG. 19 is a diagram describing a projection plane onto which the light emitted from two adjacent light-emitting devices 100 and 200 is projected. As with FIG. 17, the distances are normalized, so that another distance between the light-emitting devices 100 or 200 and the projection plane is set as 1, and also the intersection of the optical axis of the light-emitting device 100 with the projection plane is defined as the origin O, also in FIG. 19. Also, in FIG. 19, the horizontal distance between the origin O and the intersection of the optical axis of the light-emitting device 200 with the projection plane is set as 4.

FIG. 20 is a graph showing the intensity distribution of the light projected onto the projection plane in FIG. 19. As with FIG. 18, the intensity distribution of the light emitted from the light-emitting device with Lambert light distribution and projected onto the projection plane is concurrently shown, and the intensities of the light are normalized, so that another intensity of the light, which has Lambert light distribution emitted from the light-emitting device and which is projected onto the origin O, is set as 1, also in the graph shown in FIG. 20.

As shown in FIG. 20, as the resin body 103 is downsized, the light intensity at the origin O (the intersection of the projection plane with the optical axis) is increased, and the light intensity difference (unevenness in luminance) in a horizontal direction is increased. For example, the difference between the light intensities at the origin O or horizontal distance 4 (the intersection of the projection plane with the optical axes of the light-emitting devices 100 or 200) and the light intensity at horizontal distance 2 (the midpoint of the origin O and horizontal distance 4) is increased.

As described above, as the resin body 103 is downsized, unevenness in luminance of the light projected onto the projection plane and emitted from the light-emitting devices 100 and 200 is increased. Therefore, it becomes difficult to uniformly irradiate the light emitted by the light-emitting devices 100 and 200 on the projection plane.

For simplification of the description, the light-emitting device 100 provided with only the light-emitting element 102 as a light source is exemplified. However, a light-emitting device is often provided with not only a light-emitting element but also a phosphor layer (a layer comprising a resin containing a phosphor that is excited by the light emitted by a light-emitting element to emit fluorescence and the like) as a light source. The structure of this light-emitting device is shown in FIG. 21. FIG. 21 is a cross-sectional view showing a schematic structure of a conventional light-emitting device, and shows a cross section similar to the cross section shown in FIG. 14B. Here, for clarification of illustration, hatching with diagonal lines showing a cross section is omitted in FIG. 21. Also, for simplification of illustration, electrodes, wiring and the like are omitted in FIG. 21. In addition, for light-emitting device 300 shown in FIG. 21, the same reference signs are used for the same parts in the light-emitting device 100 shown in FIG. 14, and the detail description is omitted hereinafter.

As shown in FIG. 21, a phosphor layer 104 is provided so as to cover the light-emitting element 102 on the surface of the substrate 101. In this case, the light source is increased in size as compared to the case where only the light-emitting element 102 is used as a light source (refer to FIG. 14), and the ratio of the light that is not totally reflected on an opposite surface 103a (depressed surface) and emitted in the optical axis direction (light intensity on the optical axis) is dramatically increased, whereby unevenness in luminance gets worse. Furthermore, the ratio of the light emitted from the light-emitting element 102 to the outside of the resin body 103, to the light emitted from the phosphor layer 104 to the outside of the resin body 103 becomes nonuniform, and unevenness in color is also caused.

The present invention is made in view of the above problems of the conventional light-emitting device with the above structure, and an object of the present invention is to provide a light-emitting device that emits light suppressed in unevenness in luminance (furthermore, unevenness in color), a lighting device that can irradiate planar light suppressed in unevenness in luminance (furthermore, unevenness in color), and a display device that can display an image suppressed in unevenness in luminance (furthermore, unevenness in color), and provide a method for producing a light-emitting device that can easily produce the light-emitting device.

Means for Solving the Problem

In order to achieve the above objects, the present invention provides:
a light-emitting device comprising:
at least one light source,
a substrate provided with the light source on the surface, and
a resin body that seals the light source, wherein
an additional member that at least reflects or diffuses the light emitted by the light source is provided on the opposite surface opposed to the light-emitting surface of the light source on the surface of the resin body.

Furthermore, in the light-emitting device of the above characteristics, it is preferred that the light source comprise at least one light-emitting element.

Furthermore, in the light-emitting device of the above characteristics, it is preferred that the light source comprise at least one light-emitting element and a phosphor layer containing a phosphor that is excited by the light emitted by the light-emitting element to emit fluorescence.

Furthermore, in the light-emitting device of the above characteristics, it is preferred that the phosphor layer be provided so as to cover the light source on the surface of the substrate.

Furthermore, in the light-emitting device of the above characteristics, it is preferred that the additional member comprise a white resin or a light diffusing resin.

Furthermore, in the light-emitting device of the above characteristics, it is preferred that the additional member comprise fine particles of at least one of titanium oxide, alumina, silica, barium titanate, barium sulfate and zirconium oxide, dispersed in a transparent resin.

Furthermore, in the light-emitting device of the above characteristics, it is preferred that the transparent resin comprising the additional member and the resin comprising the resin body be the same resin.

Furthermore, in the light-emitting device of the above characteristics, it is preferred that the transparent resin comprising the additional member and the resin comprising the resin body be a different resin.

Furthermore, in the light-emitting device of the above characteristics, it is preferred that the transparent resin comprising the additional member and the resin comprising the resin body be a thermosetting resin.

Furthermore, in the light-emitting device of the above characteristics, it is preferred that the transparent resin comprising the additional member and the resin comprising the resin body be a silicone-based resin.

Furthermore, in the light-emitting device of the above characteristics, it is preferred that the transparent resin comprising the additional member and the resin comprising the resin body contain at least a methyl-based silicone resin or a phenyl-based silicone resin.

Furthermore, in the light-emitting device of the above characteristics, it is preferred that the additional member be a silicone resin in which fine particles of titanium oxide are dispersed, and the weight ratio of the fine particles of titanium oxide to the silicone resin be 0.1% or more and 10% or less.

Furthermore, in the light-emitting device of the above characteristics, it is preferred that, in a cross section including a normal line that is perpendicular to the surface of the substrate and passes through the light source, there exist a part where the top view length of the light source is 10% or more of the top view length of the resin body.

Furthermore, in the light-emitting device of the above characteristics, it is preferred that, in a cross section including a normal line that is perpendicular to the surface of the substrate and passes through the light source, there exist a part where the top view length of the resin body is 4.5 mm or less.

Furthermore, in the light-emitting device of the above characteristics, it is preferred that the substrate contain ceramic.

Furthermore, in the light-emitting device of the above characteristics, it is preferred that the opposite surface of the resin body be any of a concave depressed surface, a flat surface parallel to the surface of the substrate, and a convex curved surface.

Furthermore, in the light-emitting device of the above characteristics, it is preferred that the opposite surface of the resin body be a concave depressed surface, and at least a part of the depressed surface is an inclined surface of an inverted cone.

Furthermore, in the light-emitting device of the above characteristics, it is preferred that there exist the angle to maximize the intensity of the light emitted by the light-emitting device, at enough distance from the surface of the substrate, and within the range of 30 degree or more and 80 degree or less to a normal line that is perpendicular to the surface of the substrate and passes through the light source.

Furthermore, in order to achieve the above objects, the present invention provides:

a lighting device comprising a plurality of the light-emitting devices of the above characteristics, the plurality of the light-emitting devices being arranged planarly.

Furthermore, in order to achieve the above objects, the present invention provides:

a display device comprising the lighting device of the above characteristics.

Furthermore, in order to achieve the above objects, the present invention provides:

a method for producing the light-emitting device of the above characteristics, wherein in the step of providing the additional member on the opposite surface, the additional member is provided using a dispenser.

Furthermore, in the method for producing the light-emitting device of the above characteristics, it is preferred that the opposite surface be a concave depressed surface, and during the step of providing the additional member on the opposite surface, a material comprising the additional member have flowability.

Furthermore, in the method for producing the light-emitting device of the above characteristics, it is preferred that the opposite surface be a flat surface or convex curved surface parallel to the surface of the substrate, and during the step of providing the additional member on the opposite surface, a material comprising the additional member have no flowability.

Advantageous Effects of Invention

According to the light-emitting device of the above characteristics, even when a resin body is downsized, it is possible to obtain desired light distribution characteristics by a simple method that provides an additional material on the opposite surface of the surface of the resin body. Specifically, the light emitted by a light-emitting element and a phosphor layer is expanded by the additional member, and the light intensity on the optical axis is suppressed, whereby it is possible to suppress unevenness in luminance (furthermore, unevenness in color) of the light emitted by the light-emitting device.

In addition, according to the lighting device of the above characteristics, since the light-emitting device of the above characteristics is provided, it is possible to make it thinner and also irradiate planar light suppressing unevenness in luminance and unevenness in color. In addition, it is possible to reduce the number of the light-emitting devices provided on the lighting device so long as unevenness in luminance (furthermore, unevenness in color) of the light irradiated by the lighting device does not present a problem.

Moreover, according to the display device of the above characteristics, since the lighting device of the above characteristics is provided, it is possible to make it thinner and also display an image suppressing unevenness in luminance (furthermore, unevenness in color).

Also, according to the method for producing the light-emitting device of the above characteristics, it is possible to easily produce the light-emitting device of the above characteristics.

MODE FOR CARRYING OUT THE INVENTION

The embodiments of the light-emitting device, the lighting device provided with the light-emitting device and the display device provided with the lighting device according to the present invention are described below with reference to the drawings. Here, the embodiments described below are merely one example, and the light-emitting device, the lighting device and the display device according to the present invention are feasible by adding various modifications to the embodiments.

<<Light-Emitting Device>>
<First Embodiment>

Figure 1A:
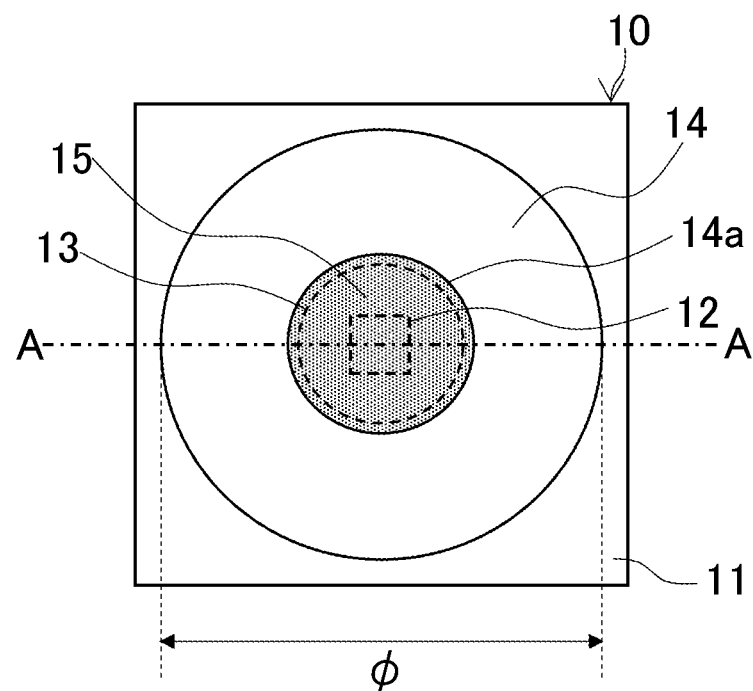
FIG. 1 is a top view and cross-sectional view showing a schematic structure of a first embodiment of the light-emitting device according to the present invention.
Figure 1B:
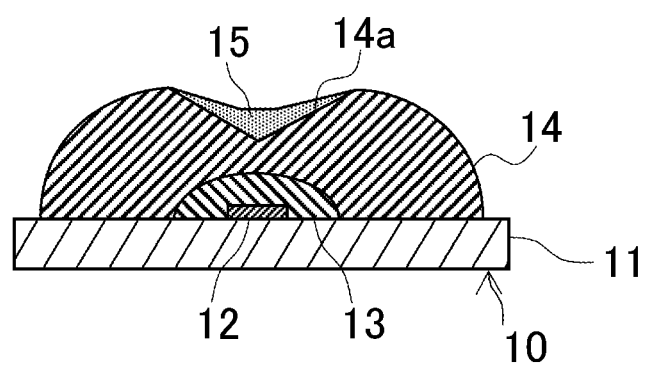

First, a first embodiment of the light-emitting device according to the present invention will be described with reference to the drawings. FIG. 1 is a top view and cross-sectional view showing a schematic structure of a first embodiment of the light-emitting device according to the present invention. FIG. 1A is a top view, and FIG. 1B is a cross-sectional view showing an A-A cross section in FIG. 1A. Here, for simplification of illustration, electrodes, wiring and the like are omitted in FIG. 1. Also, for clarification of illustration, an additional material 15 (detail is set forth below) is represented in gray in FIG. 1.

As shown in FIG. 1, a light-emitting device 10 comprises a substrate 11, a light-emitting element 12 provided on the surface of the substrate 11, a phosphor layer 13 containing a phosphor that is excited by the light emitted by the light-emitting element 12 to emit fluorescence, and a resin body 14 that seals the light-emitting element 12 and the phosphor layer 13. Furthermore, the light-emitting device 10 comprises an additional member 15 on an opposite surface 14a opposed to a light-emitting surface of the light-emitting element 12 (a surface on the side opposite to the substrate 11) on the surface of the resin body 14.

The substrate 11 comprises, for example, a material comprising mainly of ceramic, and is cuboid with each of top view four sides of 2 mm or more and 5 mm or less, and a thickness of 0.8 mm. The light-emitting element 12 is cuboid with each of top view four sides of 1 mm, and typically 0.5 mm. The phosphor layer 13 is provided on the substrate 11 so as to cover the light-emitting element 12. The phosphor layer 13 is formed as a layer with a thickness of 50 μm or more and 300 μm or less on the light-emitting element 12 and a peripheral region thereof. Here, the phosphor layer 13 can be also construed as a layer having particularly high concentration of the phosphor in the resin.

In addition, the phosphor layer 13, in the case of an example of FIG. 1, may be formed by dispensing a transparent resin containing a phosphor or the like, and there is also a method of forming a phosphor layer into a droplet utilizing thixotropy of the transparent resin, or a dam part removable afterward is formed around the light-emitting element 12, and then a phosphor layer may be formed inside the dam part (the dam part is removed after forming the phosphor layer). In addition, a sheet-form phosphor layer may be formed on the light-emitting surface of the light-emitting element 12 (or the top surface of the light-emitting element 12 or both top surface and side surface of the light-emitting element 12) by a known technology such as electrophoresis.

The light-emitting element 12 comprises a light-emitting diode emitting a blue light. The phosphor contained in the phosphor layer 13 is excited by a blue light emitted from the light-emitting element 12 to emit yellow fluorescence. Whereby, the light-emitting device 10 emits white (mixed color of blue and yellow) light.

The resin body 14 is transparent to each light emitted by the light-emitting element 12 and the phosphor layer 13, and is hemispherical and has a top view diameter of Φ. Also, in the light-emitting device 10 of the present embodiment, the opposite surface 14a of the resin body 14 is a depressed surface that is concavely depressed. In addition, at least a part (whole part in the present example) of the depressed surface is an inclined surface of an inverted cone. Furthermore, the outer shape of the depressed surface of the resin body 14 is curved convex upward in the cross section including the optical axis.

The additional member 15 at least reflects or diffuses the light emitted by the light-emitting element 12 and the phosphor layer 13. Specifically, the additional member 15 comprises a white resin or a light diffusing resin. More specifically, the additional member 15 is a transparent resin in which particles of at least one of titanium oxide, alumina, silica, barium titanate, barium sulfate, and zirconium oxide are dispersed. This transparent resin may be the same as or may be different from the resin comprising the resin body 14. For example, this transparent resin and the resin comprising the resin body 14 may be a silicone-based resin (various resins having a siloxane bond). Further specifically, the resin may be a methyl-based silicone resin (silicone resin having a methyl group) and may be a phenyl-based silicone resin (silicone resin having a phenyl group). Also, it is preferred if this transparent resin and the resin comprising the resin body 14 are a thermosetting resin.

For example, when the additional member 15 is a silicone resin in which fine particles of titanium oxide are dispersed, it is preferred if the weight ratio of the fine particles of titanium oxide to the silicone resin is 0.1% or more and 10% or less since the additional member 15 can suitably reflect or diffuse the light emitted by the light-emitting element 12 and the phosphor layer 13.

The additional member 15 is provided so as to be filled in a space enclosed by the opposite surface 14a (concave depressed surface) of the resin body 14. For example, the additional member 15 is provided on the opposite surface 14a of the resin body 14 by dripping with a dispenser. At this time, when the material comprising the additional member 15 has low viscosity (thixotropy) (for example, liquid form) and has (high) flowability, the additional member 15 can be easily and reproducibly formed. Therefore, it is possible to easily and stably produce the light-emitting device 10.

Figure 2:
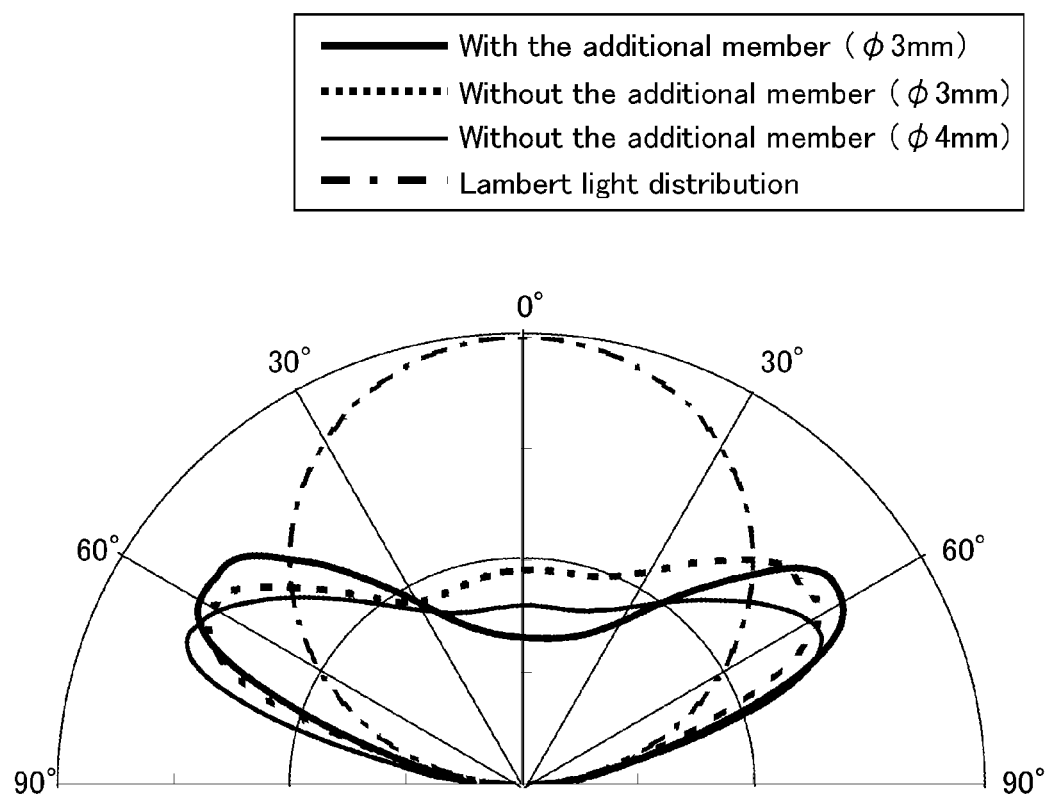
FIG. 2 is a graph showing light distribution characteristics of the light-emitting device according to the present invention.
Figure 14A:
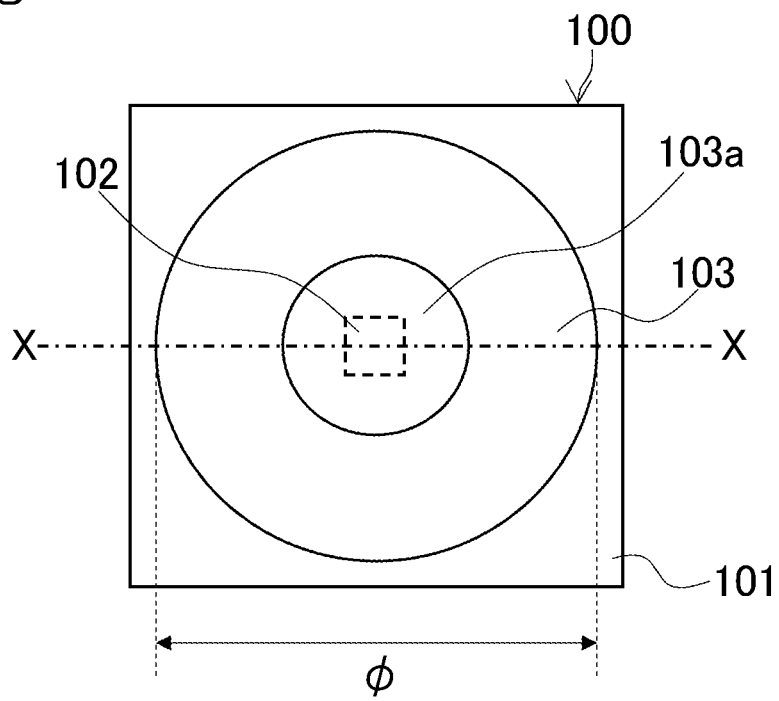
FIG. 14 is a top view and cross-sectional view showing a schematic structure of a conventional light-emitting device.
Figure 14B:
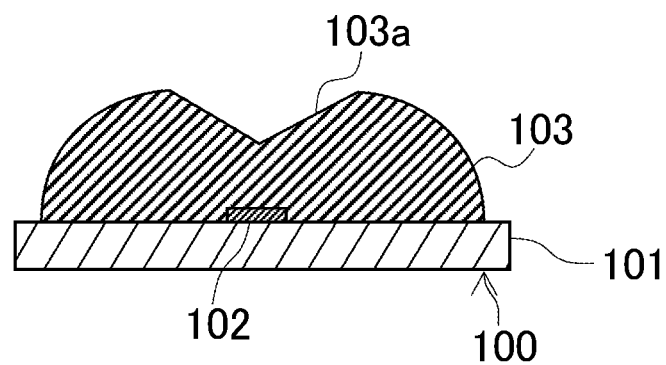
Figure 21:
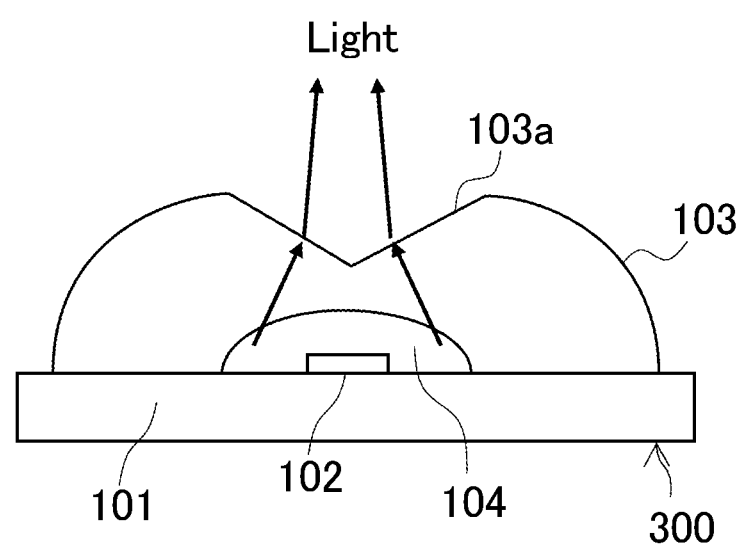
FIG. 21 is a cross-sectional view showing a schematic structure of a conventional light-emitting device.

FIG. 2 is a graph showing light distribution characteristics of the light-emitting device according to the present invention. For comparison, in the graph shown in FIG. 2, in addition to the light distribution characteristics of the light-emitting device 10 (having a diameter Φ of the resin body 14 of 3 mm) provided with the additional member 15, the light distribution characteristics of a conventional light-emitting device (having a diameter Φ of the resin body of 3 mm and 4 mm) not provided with the additional member 15 shown in FIG. 14 and FIG. 21 and Lambert light distribution are concurrently shown. Here, in FIG. 2, the size of the central angle of the hemispherical graph (namely, the angles described in circumference) shows the angle with the optical axis.

As shown in FIG. 2, in a conventional light-emitting device, when the diameter Φ of the resin body is reduced, the light intensity on the light axis (0 degree in the drawing) is increased. However, as in the light-emitting device 10 according to the present invention, when the additional member 15 is provided on the opposite surface 14a of the surface of the resin body 14, the light distribution characteristics of the light-emitting device 10 are controlled by the additional member 15, and it is possible to suppress the light intensity on the light axis. Also, in the light-emitting device 10 according to the present invention, there exists the angle to maximize the intensity of the emitted light, at enough distance from the surface of the substrate 11, and within the range of 30 degree or more and 80 degree or less to the optical axis.

As described above, even when the resin body 14 is downsized, it is possible for the light-emitting device 10 according to the present invention to obtain desired light distribution characteristics by a simple method that provides the additional material 15 on the opposite surface 14a of the surface of the resin body 14. Specifically, the light emitted by the light-emitting element 12 and the phosphor layer 13 is expanded by the additional member 15, and the light intensity on the optical axis is suppressed, whereby it is possible to suppress unevenness in luminance (furthermore, unevenness in color) of the light emitted by the light-emitting device 10.

Figure 16:
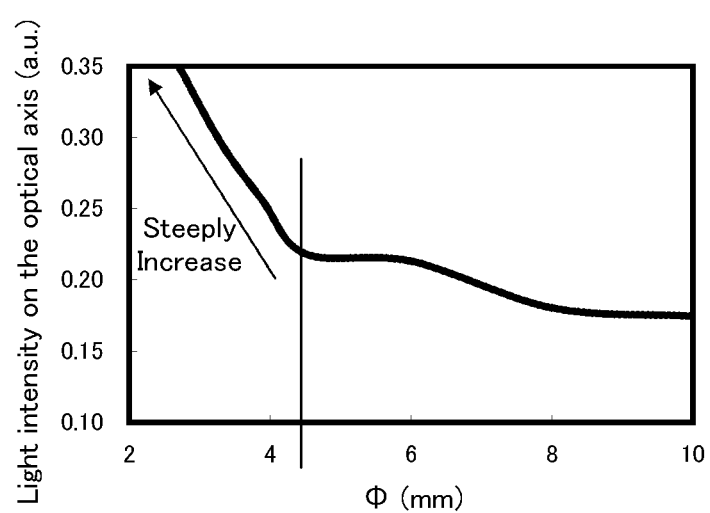
FIG. 16 is a graph showing the relationship between the diameter Φ of a resin body and the light intensity on an optical axis.
Figure 17:
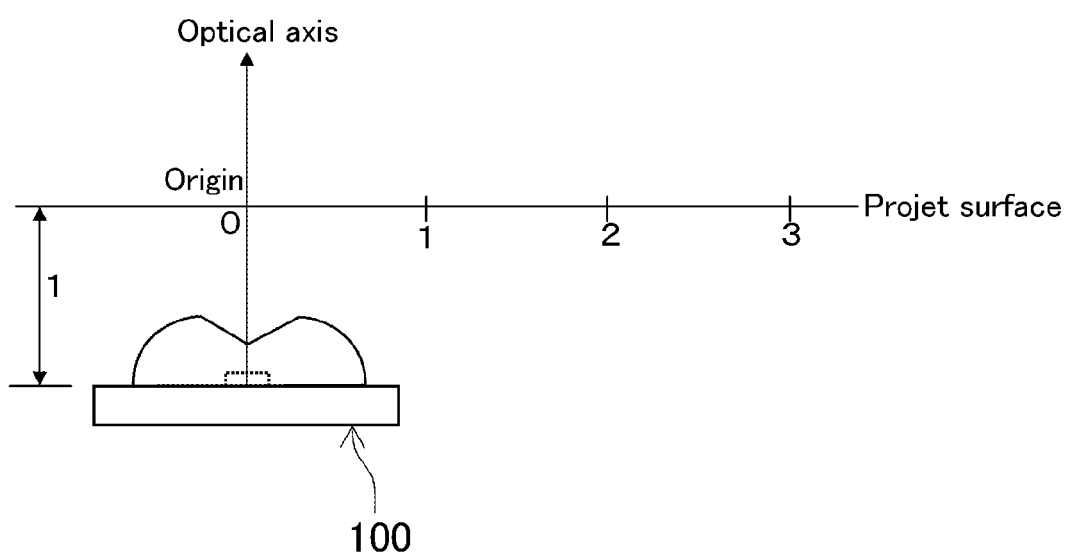
FIG. 17 is a diagram describing a projection plane onto which the light emitted from one light-emitting device is projected.
Figure 18:
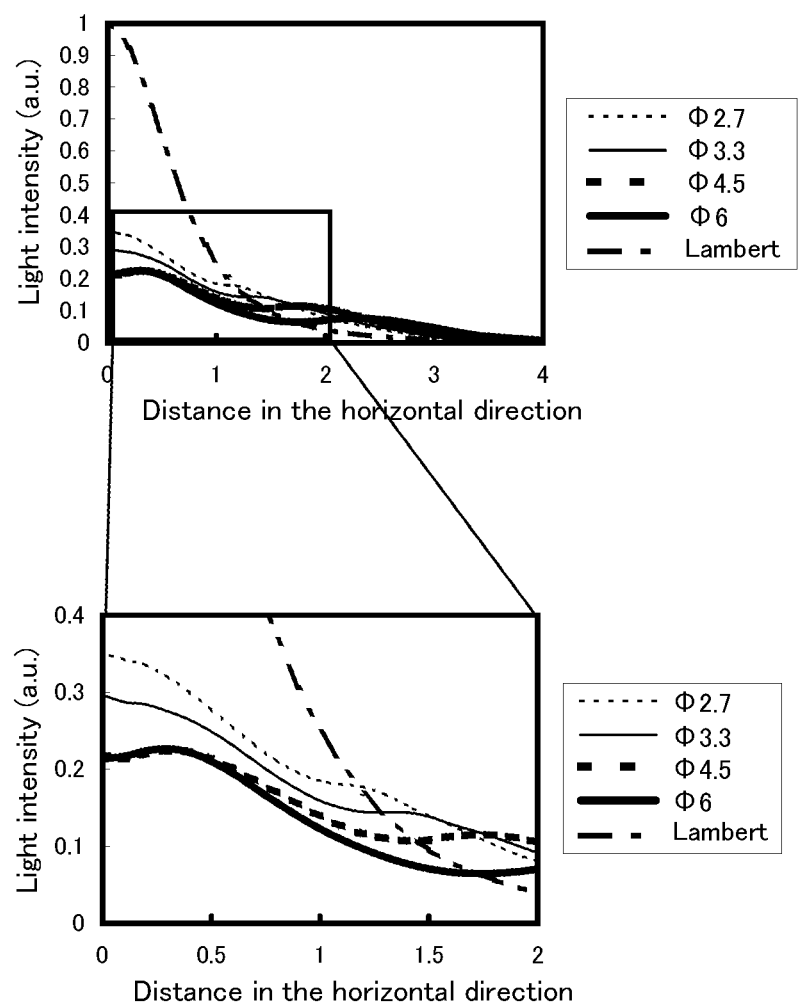
FIG. 18 is a graph showing the intensity distribution of the light projected onto the projection plane in FIG. 17.
Figure 19:
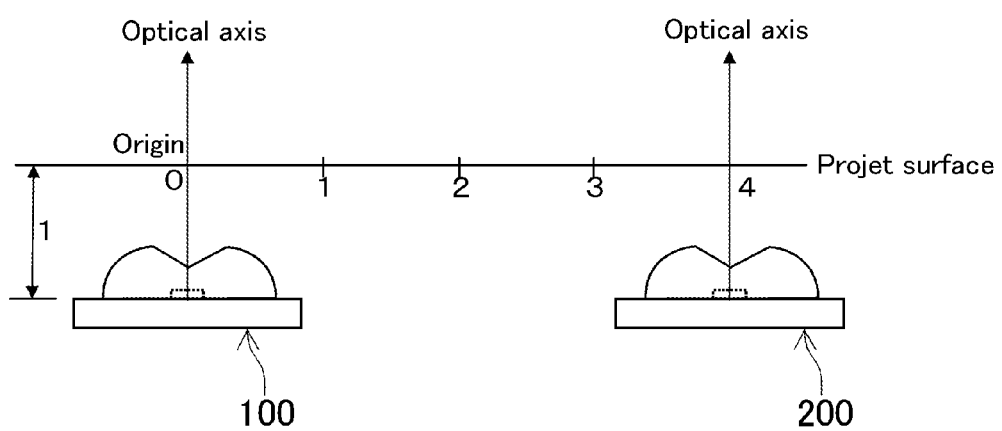
FIG. 19 is a diagram describing a projection plane onto which the light emitted from two adjacent light-emitting devices is projected.
Figure 20:
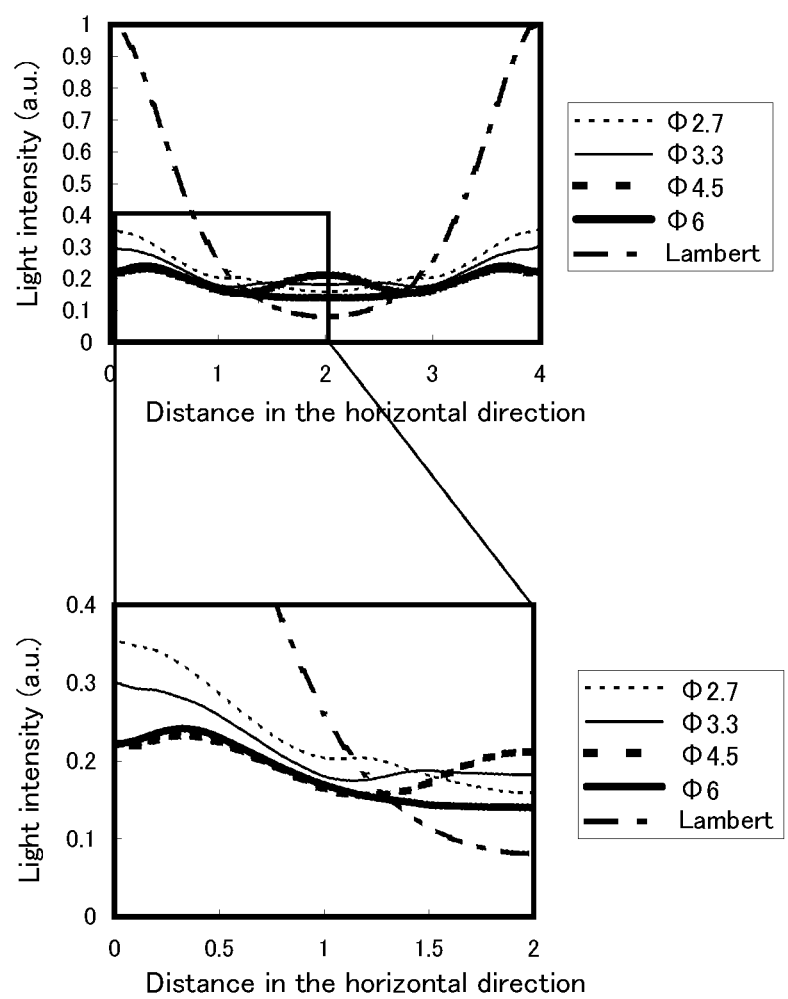
FIG. 20 is a graph showing the intensity distribution of the light projected onto the projection plane in FIG. 19.

In other words, it is possible for the light-emitting device 10 according to the present invention to downsize the resin body 14, while suppressing unevenness in luminance (furthermore, unevenness in color) of the emitted light, until the top view diameter on the light source comprising the light-emitting element 12 and the phosphor layer 13 is 10% or more of the top view diameter of the resin body 14, and further until the top view diameter of the resin body 14 is 4.5 mm or less (refer to FIG. 16 as comparative example).

<Second Embodiment>

Figure 3A:
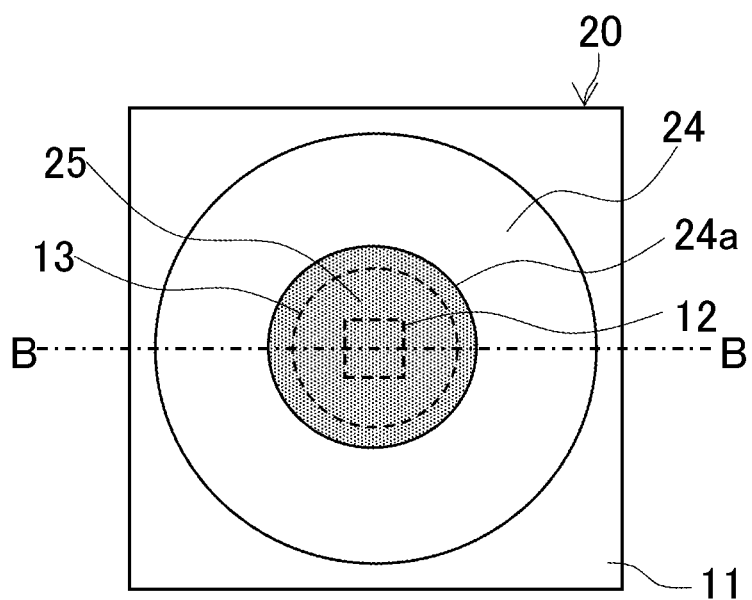
FIG. 3 is a top view and cross-sectional view showing a schematic structure of a second embodiment of the light-emitting device according to the present invention.
Figure 3B:
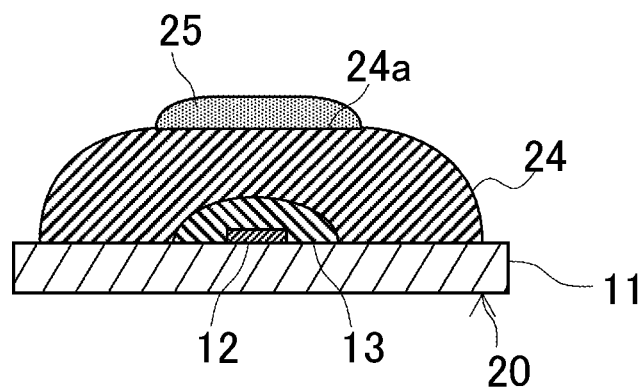

Next, a second embodiment of the light-emitting device according to the present invention will be described with reference to the drawings. FIG. 3 is a top view and cross-sectional view showing a schematic structure of a second embodiment of the light-emitting device according to the present invention. FIG. 3A is a top view, and FIG. 3B is a cross-sectional view showing a B-B cross section in FIG. 3A. Here, for simplification of illustration, electrodes, wiring and the like are omitted in FIG. 3. Also, for clarification of illustration, an additional material 25 (detail is set forth below) is represented in gray in FIG. 3. In addition, for a light-emitting device 20 shown in FIG. 3, the same reference signs are used for the same parts in the light-emitting device 10 of the first embodiment shown in FIG. 1, and the following detail description is omitted.

As shown in FIG. 3, the light-emitting device 20 comprises a substrate 11, a light-emitting element 12, a phosphor layer 13, a resin body 24 that seals the light-emitting element 12 and the phosphor layer 13, and an additional member 25 provided on an opposite surface 24a opposed to a light-emitting surface of the light-emitting element 12 on the surface of the resin body 24. In the light-emitting device 20 of the present embodiment, the opposite surface 24a of the resin body 24 is a flat surface parallel to the surface of the substrate 11.

The additional member 25 is provided on the opposite surface 24a (flat surface) of the resin body 24. At this time, since the opposite surface 24a of the resin body 24 is flat, when the material comprising the additional member 25 has high viscosity (thixotropy) and has no (low) flowability, the additional member 25 can be easily and reproducibly provided. Therefore, it is possible to easily and stably produce the light-emitting device 20. Here, since the effect of providing the additional member 25 is same as that of the light-emitting device 10 of the first embodiment, the description is omitted.

<Third Embodiment>

Figure 4A:
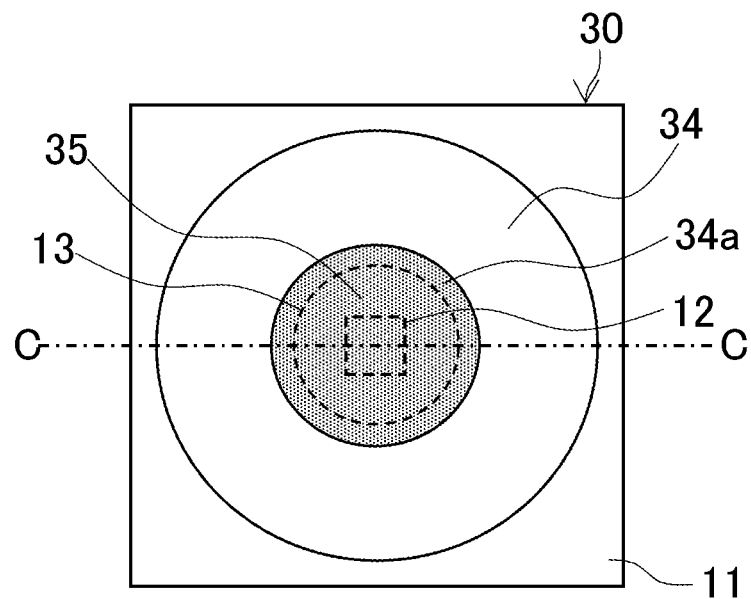
FIG. 4 is a top view and cross-sectional view showing a schematic structure of a third embodiment of the light-emitting device according to the present invention.
Figure 4B:
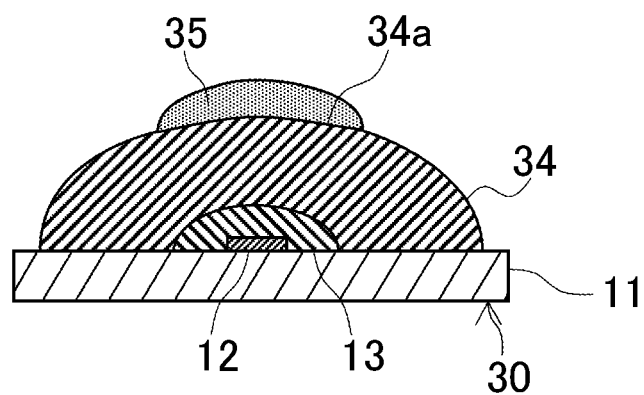

Next, a third embodiment of the light-emitting device according to the present invention is described with reference to the drawings. FIG. 4 is a top view and cross-sectional view showing a schematic structure of a third embodiment of the light-emitting device according to the present invention. FIG. 4A is a top view, and FIG. 4B is a cross-sectional view showing a C-C cross section in FIG. 4A. Here, for simplification of illustration, electrodes, wiring and the like are omitted in FIG. 4. Also, for clarification of illustration, an additional material 35 (detail is set forth below) is represented in gray in FIG. 4. In addition, for a light-emitting device 30 shown in FIG. 4, the same reference signs are used for the same parts in the light-emitting device 10 of the first embodiment shown in FIG. 1, and the following detail description is omitted.

As shown in FIG. 4, the light-emitting device 30 comprises a substrate 11, a light-emitting element 12, a phosphor layer 13, a resin body 34 that seals the light-emitting element 12 and the phosphor layer 13, and an additional member 35 provided on an opposite surface 34a opposed to a light-emitting surface of the light-emitting element 12 on the surface of the resin body 34. However, in the light-emitting device 30 of the present embodiment, the opposite surface 34a of the resin body 34 is a convex curved surface.

The additional member 35 is provided on the opposite surface 34a (convex curved surface) of the resin body 34. At this time, when the material comprising the additional member 35 has high viscosity (thixotropy) and has no (low) flowability, the additional member 35 can be easily provided (for example, applied) on the opposite surface 34a of the resin body 34. Therefore, it is possible to easily produce the light-emitting element 30. Here, since the effect of providing the additional member 35 is same as that of the light-emitting device 10 of the first embodiment, the description is omitted.

<Modification and the Like>

Figure 5A:
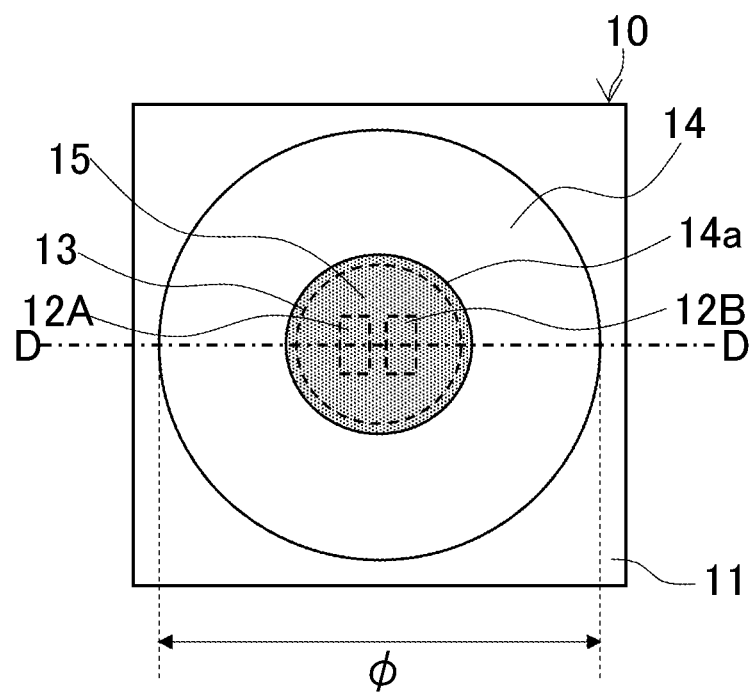
FIG. 5 is a top view and cross-sectional view showing a schematic structure of a first embodiment of the light-emitting device according to the present invention, in a case where a plurality of the light-emitting elements is provided.
Figure 5B:
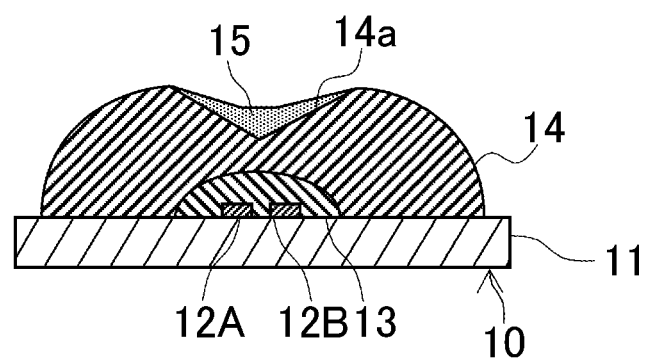

While one light-emitting element 12 that is square from top view is provided on the substrate 11 in the light-emitting devices 10, 20 and 30 of the first to third embodiments, a light-emitting element that is rectangular from top view may be provided on the substrate 11, and a plurality of light-emitting elements may be provided side by side on the substrate 11. The case where a plurality of light-emitting elements is provided on the substrate 11 is shown in FIG. 5. FIG. 5 is a first embodiment of the light-emitting device according to the present invention, and is a top view and cross-sectional view showing a schematic structure in a case where a plurality of light-emitting elements is provided. FIG. 5A is a top view, and FIG. 5B is a cross-sectional view showing a D-D cross section in FIG. 5A. As shown in FIG. 5, one opposite surface 14a, 24a or 34a may be collectively provided on each light-emitting surface of proximately disposed light-emitting elements 12A and 12B.

Here, it is possible to provide a plurality of light-emitting elements also in the light-emitting devices 20 and 30 of the second and third embodiments, as with the light-emitting device 10 of the first embodiment shown in FIG. 5. On the other hand, unlike the modification example shown in FIG. 5, each opposite surface may be provided on each light-emitting surface of dividedly disposed light-emitting elements.

Also, FIGS. 1, 3 and 4 are shown such that the top view areas of the opposite surfaces 14a, 24a and 34a are larger than the top view area of the light source containing the light-emitting element 12 and the phosphor layer 13, and contains from top view, but the top view areas of the opposite surfaces 14a, 24a and 34a may be the same or smaller than the top view area of the light source. However, the opposite surfaces 14a, 24a and 34a are at least opposed to the light-emitting surface of the light-emitting element 12.

In addition, the light emitted by the light-emitting element 12 is not limited to blue, and the light emitted by the phosphor layer 13 is not limited to yellow. The light emitted by the light-emitting element 12 and the phosphor layer 13 is arbitrarily selectable depending on the light emitted by the light-emitting devices 10, 20 and 30. For example, the light-emitting element 12 emits ultraviolet light, and the phosphor layer 13 may contain a phosphor emitting white light (for example, a phosphor each emitting red, blue and green light). Also, for example, the light-emitting element 12 emits blue light, and the phosphor layer 13 may contain a phosphor emitting white light together with blue light (for example, a phosphor each emitting red and green light). Here, the phosphor emitting light of each color can utilize a well-known one.

Moreover, the resin bodies 14, 24 and 34 may be hemispherical as described above (refer to FIGS. 1, 3 and 4) and may be frustum of a cone. Furthermore, the resin bodies may be the shape like the modification examples shown below. Here, the modification examples shown below are those modifying the light-emitting device 10 of the first embodiment described above (refer to FIG. 1), but the light-emitting devices 20 and 30 of the second and third embodiments are similarly modifiable.

Figure 6A:
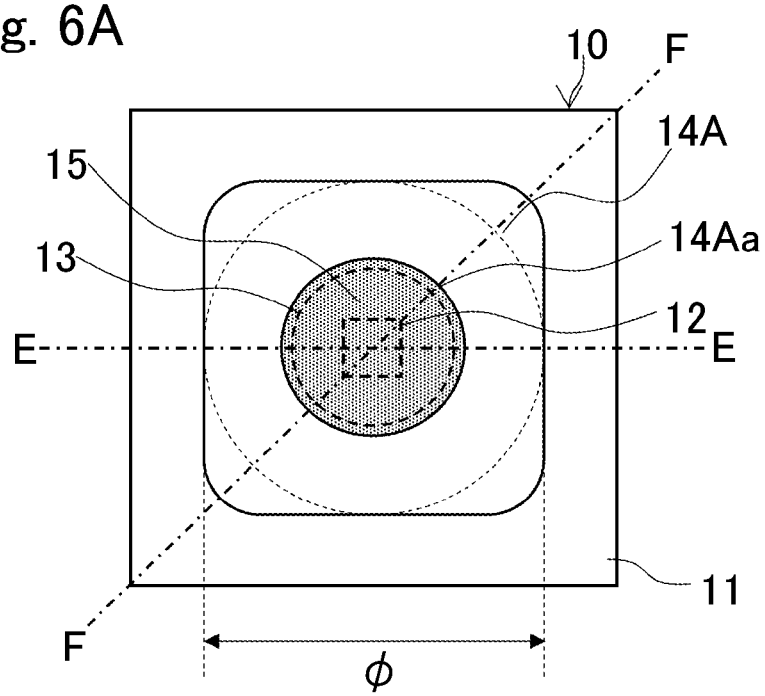
FIG. 6 is a top view and cross-sectional view showing a schematic structure of a first modification example of a first embodiment of the light-emitting device according to the present invention.
Figure 6B:
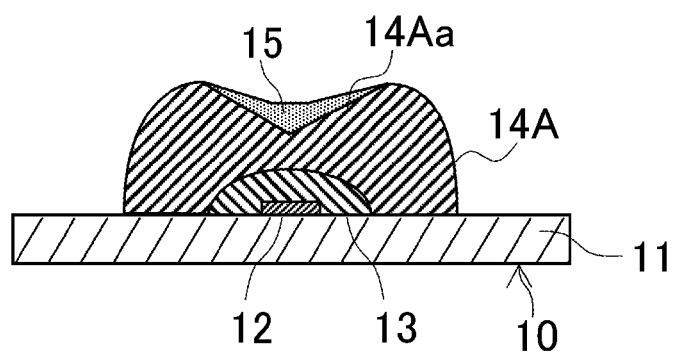
Figure 6C:
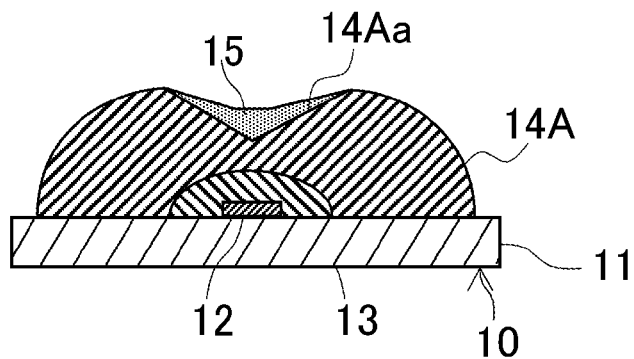

FIG. 6 is a top view and cross-sectional view showing a schematic structure of a first modification example of a first embodiment of the light-emitting device according to the present invention. FIG. 6A is a top view, FIG. 6B is a cross-sectional view showing an E-E cross section in FIG. 6A, and FIG. 6C is a cross-sectional view showing an F-F cross section in FIG. 6A. As shown in FIG. 6, the shape of the resin body 14A is square (however, corners are rounded) from top view, and the outer shape of an opposite surface 14Aa may be curved convex upward in the cross section including the optical axis.

Figure 7A:
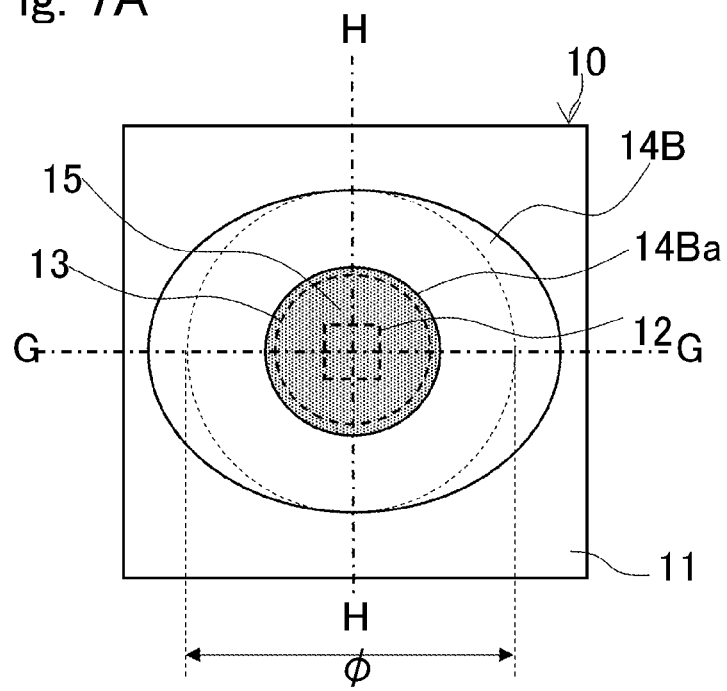
FIG. 7 is a top view and cross-sectional view showing a schematic structure of a second modification example of the first embodiment of the light-emitting device according to the present invention.
Figure 7B:
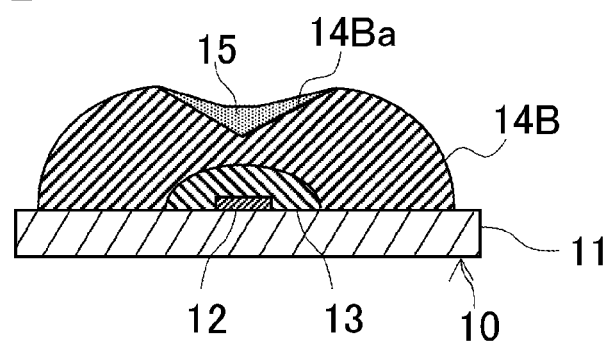
Figure 7C:
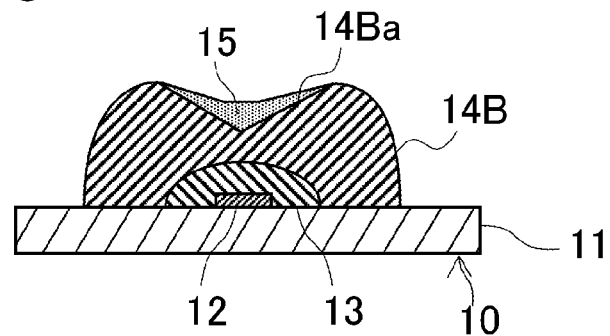

FIG. 7 is a top view and cross-sectional view showing a schematic structure of a second modification example of a first embodiment of the light-emitting device according to the present invention. FIG. 7A is a top view, FIG. 7B is a cross-sectional view showing a G-G cross section in FIG. 7A, and FIG. 7C is a cross-sectional view showing an H-H cross section in FIG. 7A. As shown in FIG. 7, the shape of the resin body 14B is ellipse from top view, and the outer shape of the opposite surface 14Ba may be curved convex upward in the cross section including the optical axis.

Figure 8A:
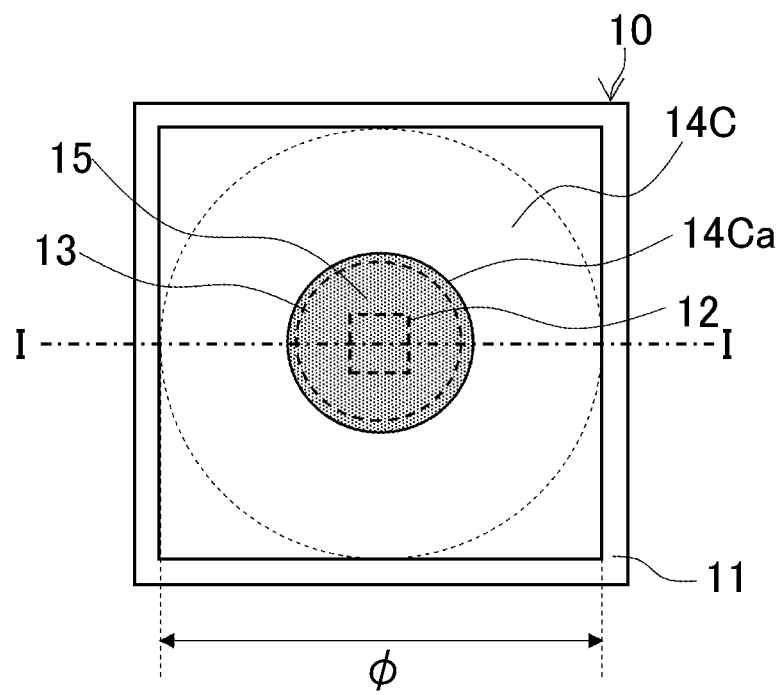
FIG. 8 is a top view and cross-sectional view showing a schematic structure of a third modification example of the first embodiment of the light-emitting device according to the present invention.
Figure 8B:
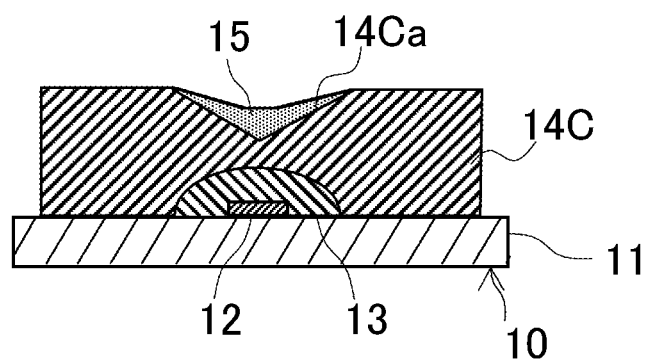

FIG. 8 is a top view and cross-sectional view showing a schematic structure of a third modification example of a first embodiment of the light-emitting device according to the present invention. FIG. 8A is a top view, and FIG. 8B is a cross-sectional view showing an I-I cross section in FIG. 8A. As shown in FIG. 8, the shape of the resin body 14C is square from top view, and may be cuboid except for the opposite surface 14Ca.

Figure 9A:
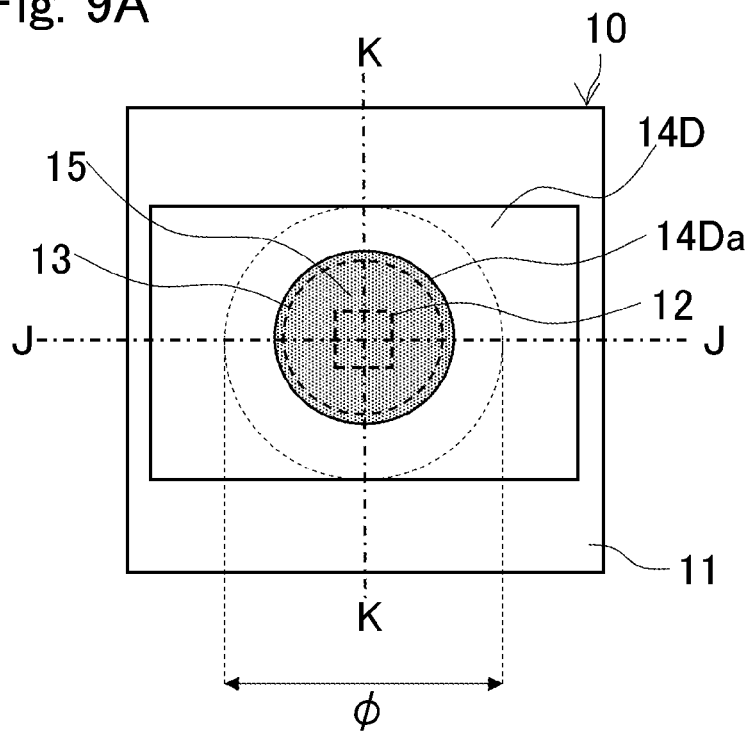
FIG. 9 is a top view and cross-sectional view showing a schematic structure of a fourth modification example of the first embodiment of the light-emitting device according to the present invention.
Figure 9B:
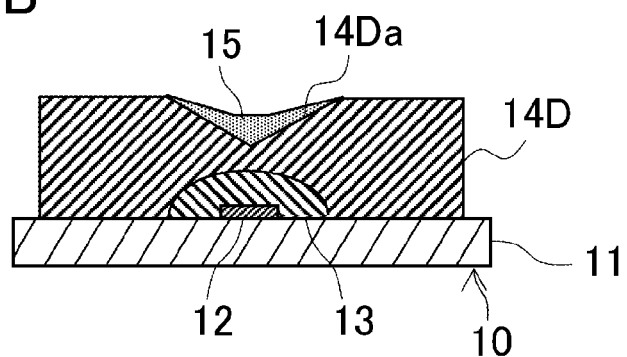
Figure 9C:
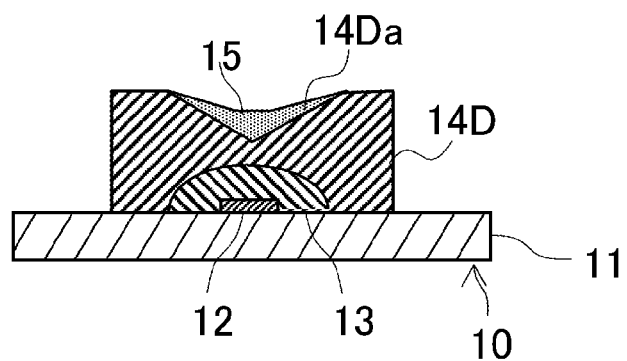

FIG. 9 is a top view and cross-sectional view showing a schematic structure of a fourth modification example of a first embodiment of the light-emitting device according to the present invention. FIG. 9A is a top view, FIG. 9B is a cross-sectional view showing a J-J cross section in FIG. 9A, and FIG. 9C is a cross-sectional view showing a K-K cross section in FIG. 9A. As shown in FIG. 9, the shape of the resin body 14D is rectangle from top view, and may be cuboid except for the opposite surface 14Da.

Figure 10A:
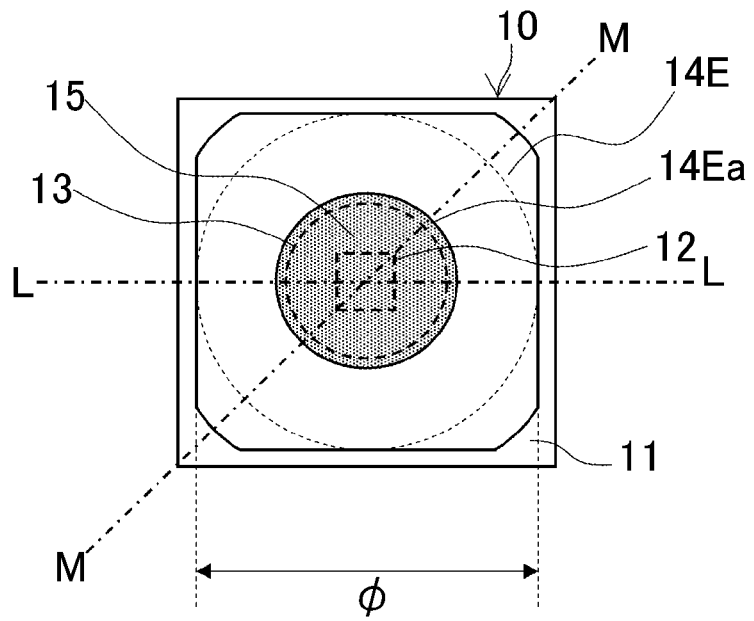
FIG. 10 is a top view and cross-sectional view showing a schematic structure of a fifth modification example of the first embodiment of the light-emitting device according to the present invention.
Figure 10B:
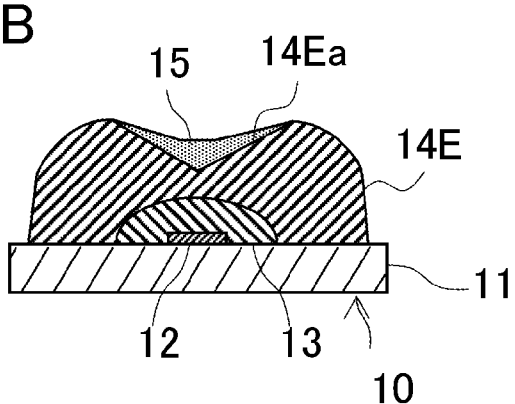
Figure 10C:
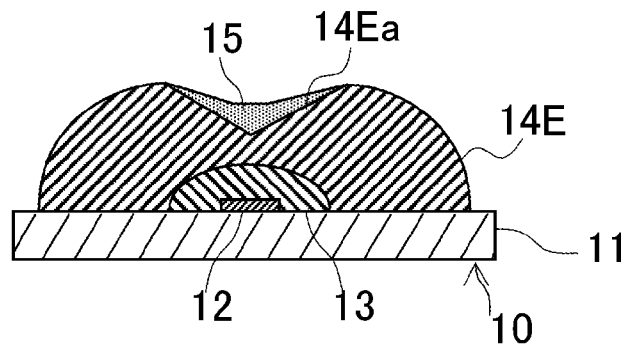

FIG. 10 is a top view and cross-sectional view showing a schematic structure of a fifth modification example of a first embodiment of the light-emitting device according to the present invention. FIG. 10A is a top view, FIG. 10B is a cross-sectional view showing an L-L cross section in FIG. 10A, and FIG. 10C is a cross-sectional view showing an M-M cross section in FIG. 10A. As shown in FIG. 10, the shape of the resin body 14E is square (however, corners are rounded) from top view, and may be curved convex upward in the cross section including the corners of the square and the optical axis in the outer side of the opposite surface 14Ea and linear in the cross section not including the corner of the square and including the optical axis in the outer side of the opposite surface 14Ea.

In FIG. 6 to FIG. 10, a circle with a diameter $\Phi$ of 4.5 mm is shown together. As described above, in the cross section including the optical axis, it is possible to suppress unevenness in luminance (furthermore, unevenness in color) in the cross section by the additional member 15 even though the resin bodies 14A to 14E are (partially, in the predetermined direction) downsized such that there exists a part where the top view length of the light source (the light-emitting element 12 and the phosphor layer 13) is 10% or more of that of the resin bodies 14A to 14E, and further there exists a part where the top view length of the resin bodies 14A to 14E is 4.5 mm or less. Since light is not leaked along the light axis in the cross section where the top view length of the resin bodies 14A to 14E is 4.5 mm or more even without the additional member 15 as described above, unevenness in luminance (furthermore, unevenness in color) is hard to occur (refer to FIG. 16).

<<Lighting Device>>

Figure 11:
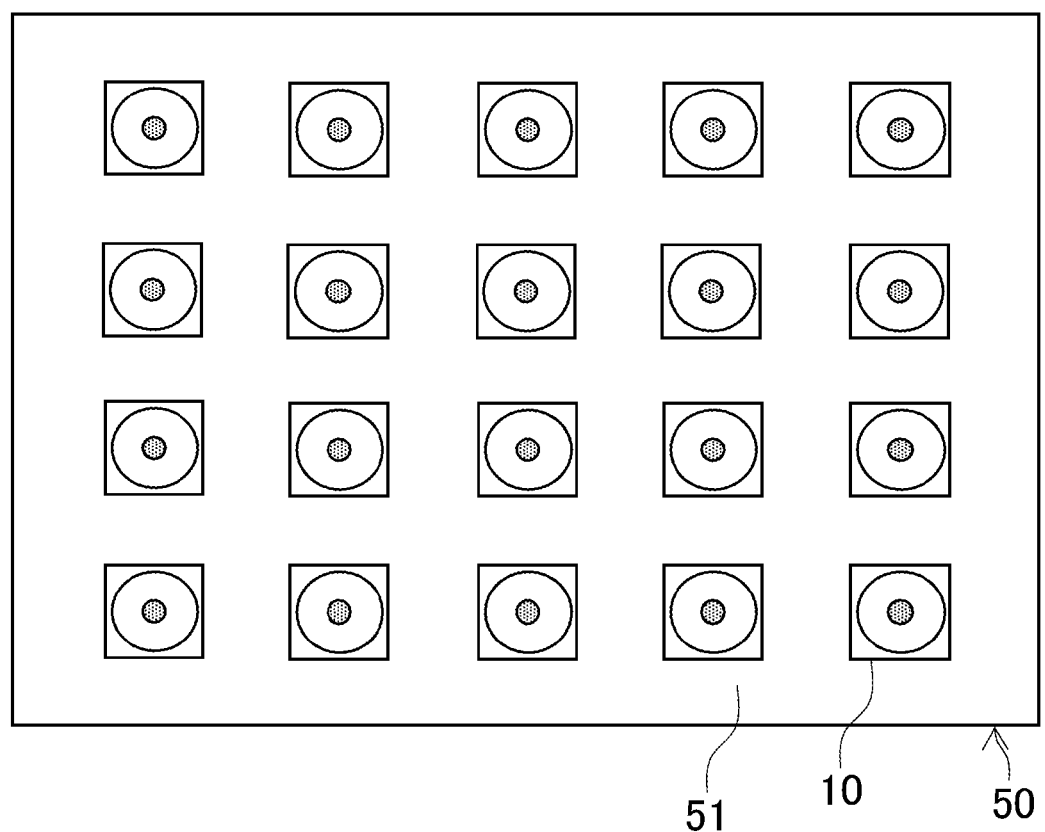
FIG. 11 is a top view showing a schematic structure of the lighting device according to the present invention.

Next, the lighting device according to the present invention is described with reference to the drawings. FIG. 11 is a top view showing a schematic structure of the lighting device according to the present invention. Here, FIG. 11 illustrates a lighting device 50 utilizing the light-emitting device 10 of the first embodiment described above, and the light-emitting devices 20 and 30 of the second and third embodiments can be also naturally utilized.

As shown in FIG. 11, the lighting device 50 comprises a plurality of light-emitting devices 10, and a mounting substrate 51 on the surface of which the light-emitting devices 10 are provided side by side. The light-emitting devices 10 are arranged on the surface of the mounting substrate 51 in a square grid pattern, for example, the interval of adjacent light-emitting devices 10 is 30 mm.

As described above, since the lighting device 50 according to the present invention comprises the light-emitting device 10 described above, it is possible to make it thinner and also irradiate planar light suppressing unevenness in luminance (furthermore, unevenness in color). In addition, it is possible to reduce the number of the light-emitting devices provided on the lighting device 50 so long as unevenness in luminance (furthermore, unevenness in color) of the light irradiated by the lighting device 50 does not present a problem.

It is preferred when a diffuser that diffuses light emitted by the light-emitting device 10 on the surface of the mounting substrate 51 since it is possible to irradiate further uniform planar light. Also, for example, it is particularly preferred when a diffuser is disposed in a location at a height of 13 mm from the light-emitting device 10 since the distribution of the light intensity on the diffuser falls within ±1%.

Figure 15:
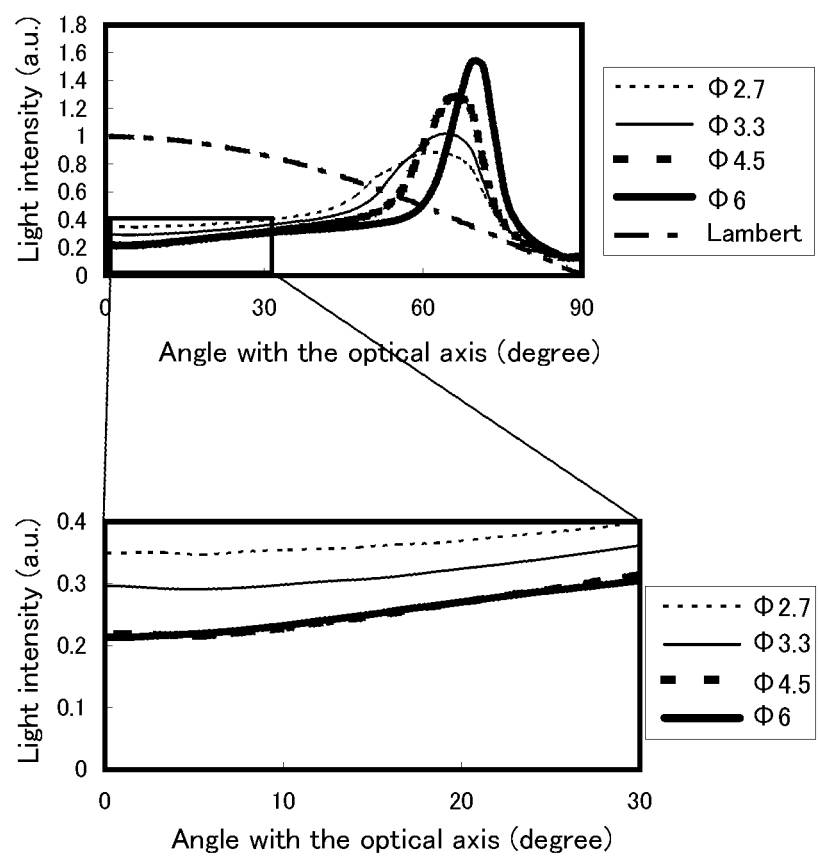
FIG. 15 is a graph showing the relationship between the diameter Φ of a resin body and the light distribution characteristics.

Incidentally, for example, in the lighting device 50 on which a plurality of the light-emitting devices 10 are provided side by side as described above, when the size of substrate 11 of the light-emitting device 10 is limited by various reasons, the diameter of the resin body 14 just has to be reduced. Then, as described with reference to FIG. 15, the problem that the light intensity on the optical axis is increased with shifting the angle to maximize the light intensity to the low angle side (optical axis side) is caused. When uniform planar light is intended to be irradiated using further less number of the light-emitting devices 10 under such limitation, it is required to expand the light emitted by the light-emitting device 10 (specifically, for example, the average of light distribution) to the high angle side as much as possible (hereinafter, described as request (A)).

In addition, for example, in the lighting device 50 on which a plurality of the light-emitting devices 10 are provided side by side as described above, when uniform planar light is intended to be irradiated using further less number of the light-emitting devices 10, it is required that light-emitting patterns of the light-emitting devices 10 (the range where a predetermined light intensity is obtained) are combined such that the void between the light-emitting patterns (dark space) is not generated as much as possible (hereinafter, described as request (B)).

When the request (A) or the request (B) is intended to be satisfied, it is preferred if, for example, the light-emitting device 10 provided with the resin body 14E that is square (however, corners are rounded. hereinafter omitted.) from top view as shown in FIG. 10 is used, rather than using the light-emitting device 10 provided with the resin body 14 that is circular from top view as shown in FIG. 1.

First, the request (A) will be described. As described with reference to FIG. 15, there is correlation between the diameter of resin body and the light-emitting pattern. Specifically, the larger the diameter of resin body, the angle to maximize the light intensity can be expanded to the high angle side. Therefore, a resin body is formed on the top surface of the substrate 11 in a limited size such that the top view diameter is increased as much as possible, whereby the request (A) can be satisfied.

Here, it can be said that the resin body 14E shown in FIG. 10 is obtained by expanding the resin body 14 shown in FIG. 1 to a diagonal direction of the substrate 11 using a space present in the diagonal direction. Therefore, when the substrate 11 is the same in size, the light-emitting device 10 provided with the resin body 14E shown in FIG. 10 can expand the emitted light to the high angle side as compared to the light-emitting device 10 provided with the resin body 14 shown in FIG. 1.

Other than the light-emitting device 10 shown in FIG. 10, it is also possible to use the light-emitting device 10 shown in FIG. 6. The light-emitting device 10 shown in FIG. 6 is also provided with resin body 14A that is square from top view as with the light-emitting device 10 shown in FIG. 10. However, the resin body 14A shown in FIG. 6 is curved in the part that is the outer side of an opposite surface 14Aa and forms four sides. On the other hand, the resin body 14E shown in FIG. 10 is planar in the part that is the outer side of an opposite surface 14Ea and forms four sides.

In addition, while the case where the top view shape of the substrate 11 is square is exemplified so far, the top view shape of the substrate 11 is not limited to square, and may be other shape. Even when the top view shape of the substrate 11 is different from square, for example, the top view shape of the resin body is properly selected so as to be a shape similar to the top view shape of the substrate 11, whereby it is possible to effectively expand the resin body and then possible to satisfy the request (A).

Figure 12A:
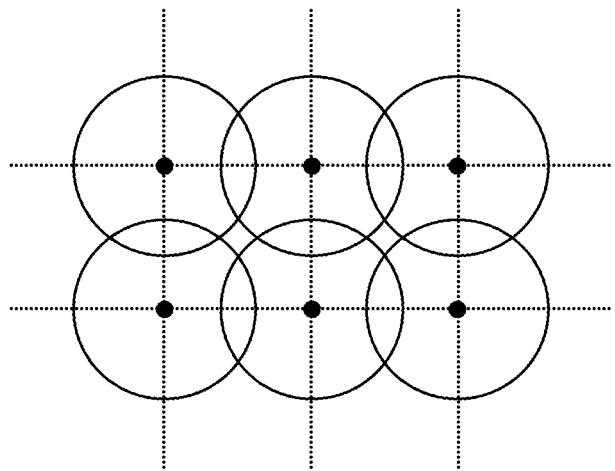
FIG. 12 is a schematic view showing a light-emitting pattern in a case where various light-emitting devices are applied to the lighting device according to the present invention.
Figure 12B:
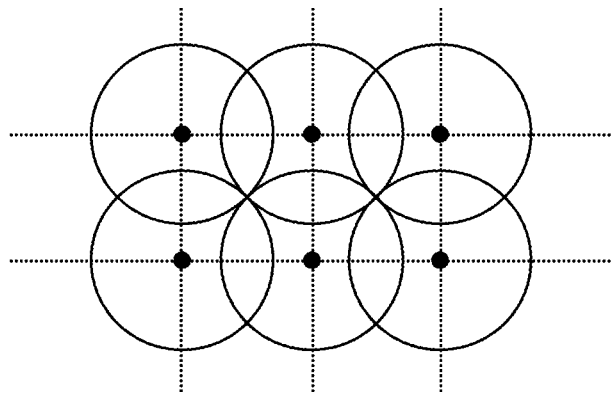
Figure 12C:
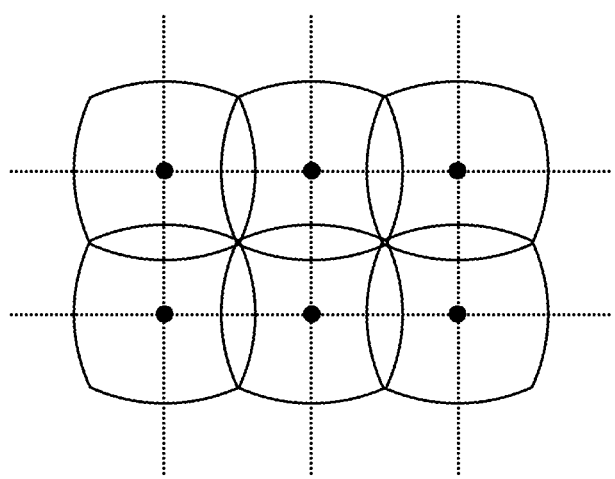

Next, the request (B) will be described below with reference to FIG. 12. FIG. 12 is a schematic view showing a light-emitting pattern in a case where various light-emitting devices are applied to the lighting device according to the present invention. FIGS. 12A and 12B are a schematic view showing a light-emitting pattern in a light-emitting device applying the light-emitting device shown in FIG. 1, and FIG. 12C is a schematic view showing a light-emitting pattern in a light-emitting device applying the light-emitting device shown in FIG. 10. In FIG. 12, the top view center of each light-emitting device 10 is shown as a filled circle, and the light-emitting pattern of each light-emitting device 10 is shown by a solid line.

As shown in FIGS. 12A and 12B, the light-emitting pattern of the light-emitting devices 10 provided with the resin body 14 that is circular from top view is circular. On the other hand, as shown in FIG. 12C, the light-emitting pattern of the light-emitting devices 10 provided with the resin body 14E that is square from top view is square (however, four sides are excurved. hereinafter omitted.). This is attributed to the correlation between the diameter of the resin body and the light-emitting pattern (the larger the diameter, the angle to maximize the light intensity can be expanded to the high angle side), as described with reference to FIG. 15.

The resin body 14 that is circular from top view shown in FIG. 1 has the same length of the diameter in any direction. Therefore, since the light expansion is equal to any direction, the light-emitting pattern is circular. On the other hand, in the resin body 14E that is square from top view shown in FIG. 10, the diameter in the diagonal direction (for example, direction in an M-M cross section in the drawing) is longer than the diameter in the four side direction (for example, direction in an L-L cross section in the drawing). Therefore, the light expansion in the diagonal direction is larger than the light expansion in the four side direction, thus the light-emitting pattern is square.

When the light-emitting devices 10 provided with the resin body 14 that is circular from top view as shown in FIG. 1 are disposed in a square grid pattern as shown in FIG. 11, dark space may be generated to the diagonal direction of array as shown in FIG. 12A. On the other hand, when the disposition interval of the light-emitting devices 10 is reduced to eliminate the dark space as shown in FIG. 12B, a number of the light-emitting devices 10 is necessary.

On the other hand, when the light-emitting devices 10 provided with the resin body 14E that is square from top view as shown in FIG. 10 are disposed in a square grid pattern as shown in FIG. 11, the light-emitting pattern can be expanded also to the diagonal direction of the array (square grid pattern) of the light-emitting devices 10 as shown in FIG. 12C. Therefore, it is possible to effectively eliminate dark space by using the light-emitting device 10 shown in FIG. 10 even when the number of disposed light-emitting devices 10 is small.

It is also possible to use the light-emitting device 10 shown in FIG. 6, in addition to the light-emitting device 10 shown in FIG. 10. The light-emitting device 10 shown in FIG. 6 is also provided with the resin body 14A that is square from top view. However, the resin body 14A shown in FIG. 6 is curved in the part that is the outer side of an opposite surface 14Aa and forms four sides. On the other hand, the resin body 14E shown in FIG. 10 is planer in the part that is the outer side of an opposite surface 14Ea and forms four sides.

Also, while the case of arranging the light-emitting devices 10 in a square grid pattern is exemplified so far, the array of the light-emitting devices 10 is not limited to a square grid pattern, and may be other states. Even when the array of the light-emitting devices 10 is different from a square grid pattern, for example, the top view shape of the resin body is properly selected so as to be a similar shape to a shape formed by grid points, whereby it is possible to effectively eliminate dark space and then possible to satisfy the request (B).

<<Display Device>>

Figure 13:
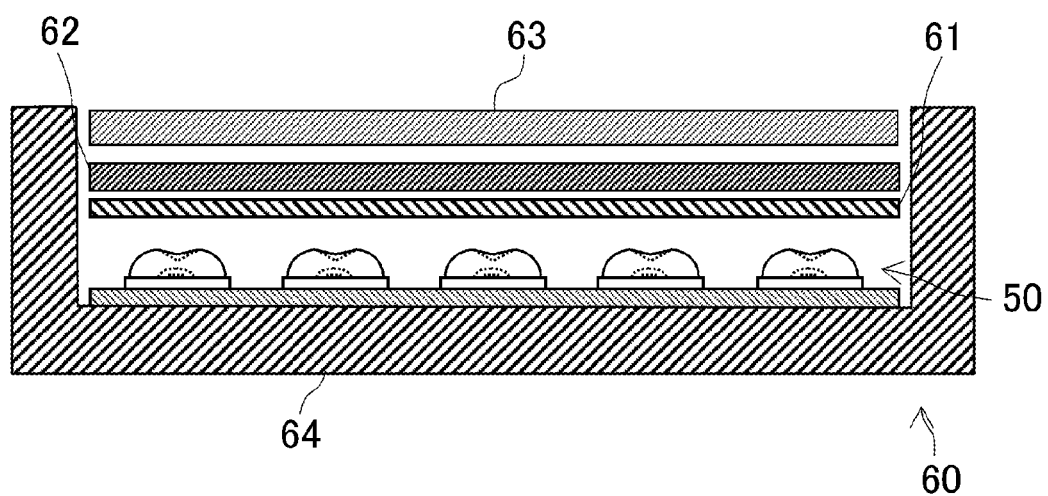
FIG. 13 is a cross-sectional view showing a schematic structure of the display device according to the present invention.

Next, the display device according to the present invention will be described with reference to the drawing. FIG. 13 is a cross-sectional view showing a schematic structure of the display device according to the present invention. Here, while FIG. 13 illustrates a display device 60 utilizing the lighting device 50 provided with the light-emitting device 10 of the first embodiment described above, the light-emitting devices 20 and 30 of the second and third embodiments can be also naturally utilized.

As shown in FIG. 13, the display device 60 comprises a lighting device 50, a diffuser 61 that diffuses light emitted by the light-emitting device 50, an optical sheet 62 that adjusts the light diffused by the diffuser 61, a liquid crystal panel 63 that selectively transmits the light adjusted by the optical sheet 62 to display an image, and a chassis 64 that accommodates the lighting device 50, the diffuser 61, the optical sheet 62 and the liquid crystal panel 63.

As described above, since the display device 60 according to the present invention comprises the light-emitting device 50 described above, it is possible to make it thinner and also display an image suppressing unevenness in luminance (furthermore, unevenness in color).

Industrial Applicability

The light-emitting device according to the present invention is applicable to a lighting device such as a backlight used in a display device such as a liquid crystal display.

Explanation of References

10, 20, 30: light-emitting device
11: substrate
12, 12A, 12B: light-emitting element
13: phosphor layer
14, 14A to 14E, 24, 34: resin body
14a, 14Aa to 14Ea, 24a, 34a: opposite surface
15, 25, 35: additional member
50: lighting device
51: mounting substrate
60: display device
61: diffuser
62: optical sheet
63: liquid crystal panel
64: chassis

The invention claimed is:

1. A light-emitting device comprising:
   at least one light source,
   a substrate provided with the light source on the surface,
   a resin body that seals the light source, and
   an additional member that at least reflects or diffuses the light emitted by the light source, wherein
   the resin body is hemispherical and has a top view diameter of 4.5 mm or less,
   in a cross section including a normal line that is perpendicular to the surface of the substrate and passes through the light source, there exists a part where the top view length of the light source is 10% or more of the top view length of the resin body, and
   a top surface of the resin body is a concave depressed surface having an inclined surface of an inverted cone, and a space enclosed by the concave depressed surface is filled with the additional member.

2. The light-emitting device according to claim 1, wherein the light source comprises at least one light-emitting element.

3. The light-emitting device according to claim 1, wherein the light source comprises at least one light-emitting element and a phosphor layer containing a phosphor that is excited by the light emitted by the light-emitting element to emit fluorescence.

4. The light-emitting device according to claim 1, wherein the additional member comprises a white resin or a light diffusing resin.

5. The light-emitting device according to claim 1, wherein the additional member comprises fine particles of at least one of titanium oxide, alumina, silica, barium titanate, barium sulfate and zirconium oxide, dispersed in a transparent resin.

6. The light-emitting device according to claim 1, wherein the substrate contains ceramic.

7. The light-emitting device according to claim 1, wherein there exists the angle to maximize the intensity of the light emitted by the light-emitting device, at enough distance from the surface of the substrate, and within the range of 30 degree or more and 80 degree or less to a normal line that is perpendicular to the surface of the substrate and passes through the light source.

8. A lighting device comprising a plurality of the light-emitting devices according to claim 1, the plurality of the light-emitting devices being arranged planarly.

9. A method for producing the light-emitting device according to claim 1, wherein,
in the step of providing the additional member on the concave depressed surface, the additional member is provided using a dispenser.

10. The light-emitting device according to claim 3, wherein the phosphor layer is provided so as to cover the light source on the surface of the substrate.

11. The light-emitting device according to claim 5, wherein the transparent resin comprising the additional member and the resin comprising the resin body are the same resin.

12. The light-emitting device according to claim 5, wherein the transparent resin comprising the additional member and the resin comprising the resin body are a different resin.

13. The light-emitting device according to claim 5, wherein the transparent resin comprising the additional member and the resin comprising the resin body are a thermosetting resin.

14. The light-emitting device according to claim 5, wherein the transparent resin comprising the additional member and the resin comprising the resin body are a silicone-based resin.

15. The light-emitting device according to claim 5, wherein the additional member is a silicone resin in which fine particles of titanium oxide are dispersed, and the weight ratio of the fine particles of titanium oxide to the silicone resin is 0.1% or more and 10% or less.

16. A display device comprising the lighting device according to claim 8.

17. The method for producing the light-emitting device according to claim 9, wherein
during the step of providing the additional member on the concave depressed surface, a material comprising the additional member has flowability.

18. The light-emitting device according to claim 14, wherein
the transparent resin comprising the additional member and the resin comprising the resin body contain at least a methyl-based silicone resin or a phenyl-based silicone resin.

* * * * *